United States Patent
Holst et al.

(10) Patent No.: US 6,833,024 B2
(45) Date of Patent: Dec. 21, 2004

(54) ABATEMENT OF EFFLUENT FROM CHEMICAL VAPOR DEPOSITION PROCESSES USING LIGAND EXCHANGE RESISTANT METAL-ORGANIC PRECURSOR SOLUTIONS

(75) Inventors: Mark Holst, Sunnyvale, CA (US); Rebecca Faller, Hayward, CA (US); Glenn Tom, New Milford, CT (US); Jose Arno, Brookfield, CT (US); Ray Dubois, Gilbert, AZ (US)

(73) Assignee: Adanced Technology Materials, Inc., Danbury, CT (US)

( * ) Notice: Subject to any disclaimer, the term of this patent is extended or adjusted under 35 U.S.C. 154(b) by 76 days.

(21) Appl. No.: 10/278,276

(22) Filed: Oct. 23, 2002

(65) Prior Publication Data

US 2003/0056726 A1 Mar. 27, 2003

Related U.S. Application Data

(62) Division of application No. 09/420,107, filed on Oct. 18, 1999, now Pat. No. 6,500,487.

(51) Int. Cl.$^7$ .................... B01D 53/04; C23C 16/00
(52) U.S. Cl. ............... 96/108; 96/109; 96/111; 96/134; 96/142; 96/143; 423/210; 423/230; 423/250; 73/23.2; 118/715
(58) Field of Search ............ 118/715; 96/108, 96/109, 111, 126, 34, 142–146; 423/210, 220, 230, 226, 236, 234.1; 73/24.01, 23.2, 658

(56) References Cited

U.S. PATENT DOCUMENTS

| | | | |
|---|---|---|---|
| 4,842,621 A | 6/1989 | Robbins et al. ............ 55/26 |
| 4,842,746 A | 6/1989 | Fowler et al. | |
| 5,114,683 A | 5/1992 | Hirase ....................... 422/173 |
| 5,151,110 A | 9/1992 | Bein et al. ................... 55/75 |
| 5,151,395 A | 9/1992 | Tom ........................... 502/67 |
| 5,187,131 A | 2/1993 | Tigglebeck et al. .......... 502/34 |
| 5,356,849 A | 10/1994 | Matviya et al. ............ 502/180 |
| 5,417,934 A | 5/1995 | Smith et al. ............... 422/177 |
| 5,443,623 A * | 8/1995 | Jonas et al. .................. 95/101 |
| 5,444,249 A | 8/1995 | Wong | |
| 5,445,008 A | 8/1995 | Wachter et al. .......... 73/24.06 |
| 5,494,869 A | 2/1996 | Hayden et al. ............ 502/22 |
| 5,648,114 A | 7/1997 | Paz De Araujo et al. .......... 427/126.3 |

(List continued on next page.)

OTHER PUBLICATIONS

B. Zorich & M. Majors, "Safety and Environmental Concerns of CVD Copper Precursors" Solid State Tech. Sep. 1998, pp. 101–106.

Laura Mendicine, Paul Thomas Brown, "The Environment, Health and Safety Side of Copper Metalization," Semiconductor Inter., Jun. 1998, pp. 105–110.

*Primary Examiner*—Jeffrie R. Lund
(74) *Attorney, Agent, or Firm*—Margaret Chappuis; Marianne Fuierer; Tristan Anne Fuierer

(57) ABSTRACT

Apparatus and method for abatement of effluent from multi-component metal oxides deposited by CVD processes using metal source reagent liquid solutions which comprise at least one metal coordination complex including a metal to which is coordinatively bound at least one ligand in a stable complex and a suitable solvent medium for that metal coordination complex e.g., a metalorganic chemical vapor deposition (MOCVD) process for forming barium strontium titanate (BST) thin films on substrates. The effluent is sorptively treated to remove precursor species and MOCVD process by-products from the effluent. An endpoint detector such as a quartz microbalance detector may be employed to detect incipient breakthrough conditions in the sorptive treatment unit.

13 Claims, 1 Drawing Sheet

U.S. PATENT DOCUMENTS

| | | | | |
|---|---|---|---|---|
| 5,820,664 | A | | 10/1998 | Gardiner et al. ........ 106/287.17 |
| 5,827,947 | A | | 10/1998 | Miller et al. ............... 73/24.06 |
| 5,928,426 | A | * | 7/1999 | Aitchison .................... 118/715 |
| 6,030,591 | A | * | 2/2000 | Tom et al. ................ 423/240 S |
| 6,090,208 | A | * | 7/2000 | Han ........................... 118/715 |
| 6,099,649 | A | | 8/2000 | Schmitt et al. ............. 118/715 |
| 6,110,531 | A | | 8/2000 | Paz de Araujo et al. ..................... 427/255.25 |
| 6,238,514 | B1 | * | 5/2001 | Gu ........................ 156/345.29 |
| 6,279,503 | B1 | * | 8/2001 | Choi et al. .................. 118/715 |
| 6,328,804 | B1 | * | 12/2001 | Murzin et al. ......... 427/255.28 |
| 6,383,300 | B1 | * | 5/2002 | Saito et al. .................. 118/715 |
| 6,391,385 | B1 | * | 5/2002 | Holst et al. .................. 427/250 |
| 6,500,487 | B1 | * | 12/2002 | Holst et al. ............... 427/248.1 |
| 6,537,353 | B2 | * | 3/2003 | Holst et al. .................... 96/108 |
| 6,749,671 | B2 | * | 6/2004 | Holst et al. .................... 96/108 |
| 2002/0094380 | A1 | * | 7/2002 | Holst et al. .................. 118/715 |
| 2003/0056726 | A1 | * | 3/2003 | Holst et al. .................. 118/715 |
| 2003/0136265 | A1 | * | 7/2003 | Holst et al. .................... 96/108 |

* cited by examiner

ABATEMENT OF EFFLUENT FROM CHEMICAL VAPOR DEPOSITION PROCESSES USING LIGAND EXCHANGE RESISTANT METAL-ORGANIC PRECURSOR SOLUTIONS

This is a division of U.S. application Ser. No. 09/420,107. File date Oct. 18, 1999 now U.S. Pat. No. 6,500,487.

BACKGROUND OF THE INVENTION

1. Field of the Invention

The present invention relates to a method and apparatus for abatement of effluent from any CVD process using a metal source reagent liquid solution comprising at least one metal coordination complex including a metal to which is coordinatively bound at least one ligand in a stable complex and a solvent for that metal coordination complex e.g., abatement of effluent from a multi-component metal oxide chemical vapor deposition (CVD) process used for forming barium strontium titanate (BST) thin films on substrates.

2. Description of the Related Art

BST is an important material in the semiconductor manufacturing industry for fabrication of thin film dielectric microelectronic devices. Such fabrication typically is carried out by chemical vapor deposition (CVD), in which precursors (source reagents) for the respective barium, strontium and titanium components of the product film are volatilized for use in the deposition process.

The source reagents for the BST film formation process may be provided to the CVD reactor by a liquid delivery process, in which the metalorganic precursors for the barium, strontium and titanium components are dissolved in a suitable solvent medium such as n-butyl acetate or tetrahydrofuran. The liquid solution containing precursors and corresponding solvent (separate solutions of different precursors can also be used) is pumped into a vaporizer comprising a hot zone maintained at low pressure. In the vaporizer, the liquid solution is vaporized at high rate ("flash vaporized") under controlled temperature, pressure, and flow conditions. The vaporizer is advantageously flushed with solvent immediately before and after deposition to prevent accumulation of solid species that could cause clogging in the process equipment and associated piping, valves and fittings.

In the vaporizer, or downstream therefrom, the precursor vapor is combined with a carrier gas (e.g., argon or nitrogen) and an oxidizer (e.g., oxygen or nitrous oxide). The combined precursor vapor mixture then is flowed to the CVD deposition chamber.

The CVD deposition chamber is typically operated at low pressure, e.g., on the order of 100 millitorr, by deployment of a dry pump or wet pump on the discharge of the system. In such chamber, the precursors are decomposed on the heated substrate by a thermal reaction of the combined gases, organic vapors, and metalorganic precursors, resulting in the deposition of a thin perovskite film of BST material on the wafer substrate. After chemical deposition, the wafer coated with the BST film is transferred to a separate chamber for annealing.

The effluent from the CVD deposition chamber in the CVD BST process comprises organic species, metals, unreacted precursor, precursor decomposition species and other thermal reaction products deriving from the CVD operation.

Currently, there is no effective abatement scheme commercially available for the effluent of such CVD BST process.

The foregoing issues are not unique to the CVD BST process. They also apply to other multi-component metal oxides deposited by CVD processes using metal source reagent liquid solutions which comprise at least one metal coordination complex including a metal to which is coordinatively bound at least one ligand in a stable complex and a suitable solvent medium for that metal coordination complex. These include the multi-component metal oxide CVD processes using ligand exchange resistant metal-organic precursor solutions described in U.S. Pat. No. 5,820,664 issued Oct. 13, 1998 to Gardiner et al. and assigned to Advanced Technology Materials, Inc., Danbury, Conn.

SUMMARY OF THE INVENTION

The present invention relates to abatement of effluent produced by multi-component metal oxides deposited by CVD processes using metal source reagent liquid solutions which comprise at least one metal coordination complex including a metal to which is coordinatively bound at least one ligand in a stable complex and a suitable solvent medium for that metal coordination complex e.g., CVD of BST.

In one aspect, the invention relates to a method for abatement of effluent from a CVD process for depositing a multi-component metal oxide film on a substrate, in which the effluent is flowed through a sorbent bed having sorptive affinity for contaminant species (precursor species and CVD process by-products) in the effluent.

In a specific embodiment, effluent from the CVD process is flowed in sequence through a metals trap, a motive fluid driver, and a sorbent bed having sorptive affinity for contaminant species in the effluent.

The method may further comprise monitoring the effluent discharged from the sorbent bed, to detect breakthrough of a selected contaminant component.

The invention relates in another aspect to an apparatus for abatement of effluent from a CVD process for depositing multi-component metal oxide on a substrate from a precursor composition, wherein the apparatus comprises a sorbent bed having sorptive affinity for contaminants in the effluent. Such sorbent bed may be part of an effluent flow circuit including a metals trap, a motive fluid driver, and a sorbent bed having sorptive affinity for contaminants in the effluent, optionally equipped with an endpoint detector for detecting the endpoint of sorption of the sorbent bed.

The apparatus described above may further include a semiconductor manufacturing facility whose operation comprises the CVD process.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
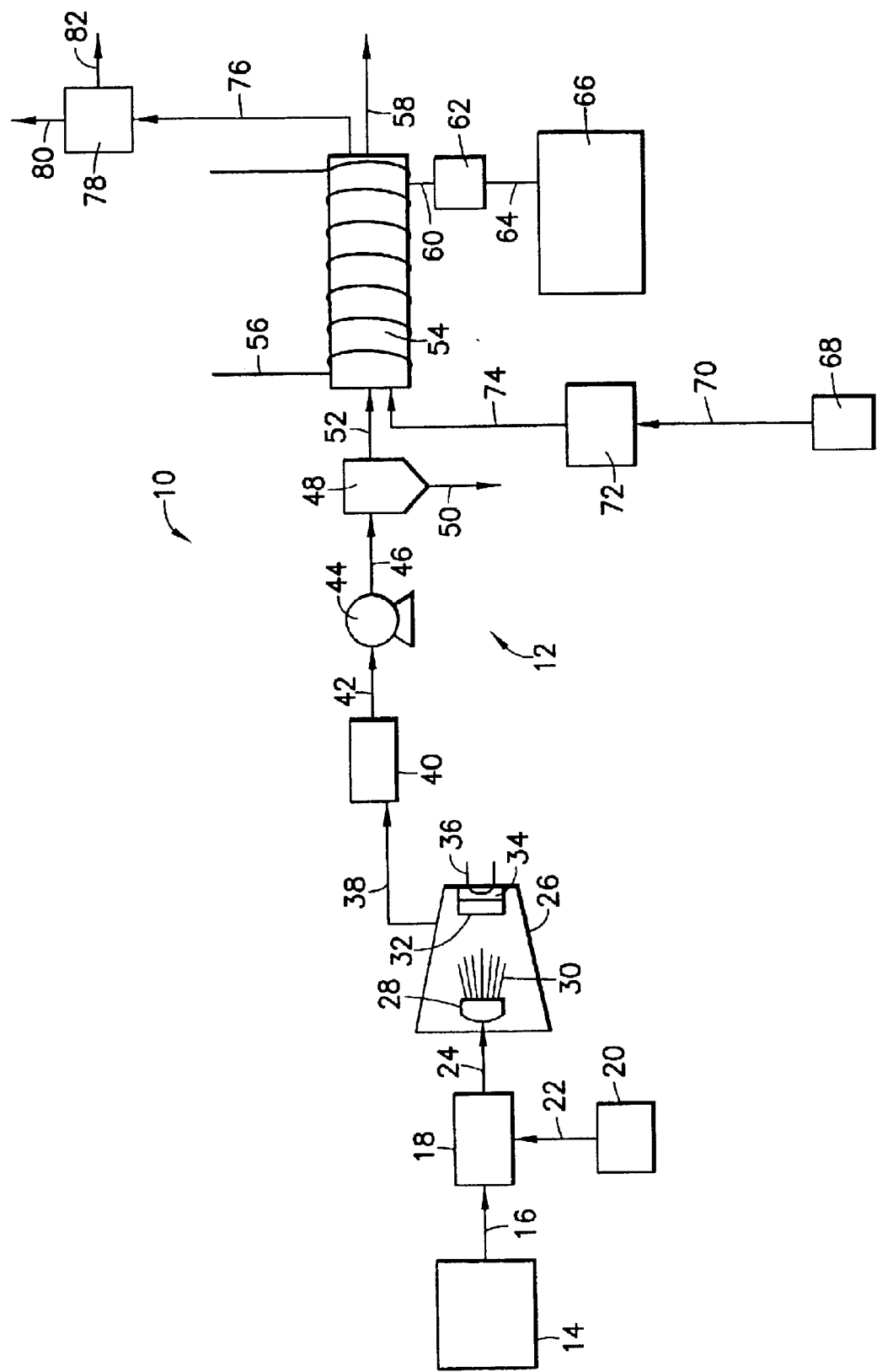
FIG. 1 is a schematic representation of an CVD multi-component metal oxide film fabrication facility including an effluent abatement system according to one embodiment of the present invention.

The present invention provides an effluent abatement system for treatment of effluent streams from multi-component metal oxides deposited by CVD processes using metal source reagent liquid solutions which comprise at least one metal coordination complex including a metal to which is coordinatively bound at least one ligand in a stable complex and a suitable solvent medium for that metal coordination complex e.g., CVD BST processes.

Although illustrated herein with reference to a specific examples involving treatment of effluent from a CVD BST process, it will be recognized that the apparatus and methodology disclosed herein may be widely and effectively employed for the abatement of streams deriving from operations utilizing multi-component metal oxides deposited by CVD processes using metal source reagent liquid solutions which comprise at least one metal coordination complex including a metal to which is coordinatively bound at least one ligand in a stable complex and a suitable solvent medium for that metal coordination complex. These include the multi-component metal oxides deposited by CVD processes using ligand exchange resistant metal-organic precursor solutions described in U.S. Pat. No. 5,820,664 issued Oct. 13, 1998 to Gardiner et al. the disclosure of which is hereby incorporated herein by reference in its entirety.

FIG. 1 shows a schematic representation of an CVD multi-component metal oxide film fabrication facility 10 including an effluent abatement system 12 according to one embodiment of the present invention.

In the FIG. 1 facility, a multi-component metal oxide source reagent or precursor material is furnished from source 14 thereof. The source 14 may comprise a reservoir containing a liquid solution of the precursor material. Alternatively, the source 14 may comprise a blending or synthesis unit wherein the liquid precursor is made or formulated in the first instance.

From the source 14, the liquid precursor flows in line 16 to the vaporizer unit 18, wherein the liquid precursor is flash vaporized for volatilization thereof to form corresponding precursor vapor. Concurrently, additional gases, e.g., a carrier gas, such as argon, helium, hydrogen, etc., and an oxidant, such as oxygen, nitrogen oxide, etc., are flowed from the gas supply unit 20 in line 22 to the vaporizer unit 18. The carrier gas entrains the precursor vapor and together with the introduced oxidant gas forms a precursor vapor mixture.

The carrier gas and oxidant gas may alternatively be separately introduced or alternatively the oxidant gas may be introduced downstream of the vaporizer before entry of the precursor vapor mixture into the CVD chamber. As a still further alternative, the oxidant gas may be directly introduced into the CVD chamber.

The precursor vapor mixture flows from the vaporizer unit 18 to the CVD reactor 26, and is dispersed in the interior volume of the reactor by showerhead discharge device 28 as a vapor flow stream 30. The stream of precursor vapor mixture thereby is directed to and impinges on a wafer substrate 32 positioned on susceptor 34 heated by heating element 36. The wafer substrate is maintained at a sufficiently elevated temperature to cause decomposition of the precursor vapor mixture and the chemical vapor deposition of the multi-component metal oxide film on the surface of the wafer substrate.

An effluent comprising waste gases and decomposition by-products is discharged from the reactor 26 and flowed in line 38 to the effluent abatement system 12.

The effluent abatement system 12 comprises an optional metals trap 40, to remove metal components of the effluent that could otherwise be deleterious in passage through the subsequent pump 44. The metals trap may be of any suitable form, comprising e.g., a cold trap, a high surface area metals trap such as a foraminous filter through which the effluent is flowed, a liquid contacting chamber for gas-liquid contacting of the effluent with an ultra-low volatility liquid (such as Krytox® or Fomblin® liquids), etc.

As a specific example, the metals trap 40 may include a cold trap device comprising a suitable means for chilling the effluent to appropriate temperature. Such means may for example comprise a heat exchanger through which the effluent is flowed in indirect heat exchange relationship with a coolant fluid, a chiller-tracing on the line 38, an embedded resistance cooling element disposed in the line for cooling of the effluent gas stream as it flows therethrough, a packed column of high heat capacity packing elements that are continuously or intermittently cooled, e.g., by cryogenic or other refrigeration means, a heat pipe unit arranged for extracting heat from the effluent, or any other means by which the effluent is suitably cooled.

The metals trap may also be constituted to remove from the effluent components other than metals, e.g., heavy organic components, such as in a cold trap wherein such species are condensed, or in a gas-liquid contacting unit wherein such species are solubilized in the contacting liquid.

From the metals trap 40, the effluent flows in line 42 to the pump 44, which serves as a motive fluid driver for the effluent stream. While a pump is illustratively shown, it will be appreciated that any other motive fluid driver may be employed, e.g., a compressor, eductor, turbine, fan, blower, etc. The pump may be constructed and operated to provide an appropriate pressure level in the upstream reactor 26, e.g., a subatmospheric pressure level.

The pump discharges the effluent into discharge line 46, from which it flows to the optional post-pump cold trap 48. In the cold trap 48, condensable and/or solidifiable components may be extracted from the effluent under appropriate temperature conditions, and discharged from the cold trap in line 50 for recovery and/or reuse. The resultantly treated effluent then is flowed in line 52 to the sorbent bed 54.

The cold trap 48 may be optionally used in place of or as an adjunct to the provision of the optional metals trap 40. For example, the metals trap 40 may comprise a particulate filter for recovering metals and other components, and the cold trap 48 then may be operated to recover heavy organics and metal-containing species susceptible to condensation or solidification in the cold trap.

Alternatively, the metals trap 40 may comprise a first cold trap removing species potentially deleterious to the pump, so that the cold trap 48 constitutes a second cold trap for removing further components of the effluent. In this fashion, the cold trap 48 could be operated at lower temperature than the cold trap of metals trap 40, e.g., with a same heat exchange fluid chilling the second cold trap 48 and then cooling the cold trap of metals trap 40, so that the effluent is thereby successively reduced in temperature to a low level temperature that maximizes subsequent physisorption.

Alternatively, the optional process unit 48 rather than comprising a cold trap may comprise a heating unit for raising the temperature of the effluent to a temperature that maximizes subsequent chemisorption.

It therefore is seen that the effluent abatement process of the invention may be flexibly constituted in connection with a sorbent treatment step that may involve physisorption and/or chemisorption.

The effluent gas in line 52 is therefore flowed to sorbent bed 54. Sorbent bed 54 comprises a vessel containing a sorbent material having sorptive affinity for the components of the effluent that are to be removed. Sorbent materials may include physical adsorbents and/or chemisorbents, as desired and appropriate to the removal operation to be carried out.

Although illustratively shown as comprising a single adsorber unit, the sorbent bed may in fact be a multiple bed arrangement comprising sorbent beds variously connected in series and/or parallel (manifolded) arrangements. After sorptive treatment in the sorbent bed 54, the resultantly treated effluent is flowed from the sorbent bed in line 58, and may be discharged to the atmosphere or further treated or processed, as necessary or desired in a given end use application of the invention.

For regeneration purposes, the sorbent bed may be wrapped with a heating coil 56. The heating coil may comprise an electrical resistance heating tape, a stream-tracing line, a heat exchange coil through which a suitable heat transfer fluid may be selectively flowed, or any other appropriate heating means.

As an additional feature accommodating regeneration of the sorbent bed, the sorbent bed may be coupled with a source 68 of a regeneration fluid, which is selectively flowable in line 70 to the heater 72 for heating to elevated temperature appropriate to effect desorption of the sorbed species from the sorbent bed during the regeneration operation. The resultantly heated fluid is flowed from the heater 72 in line 74 to the sorbent bed, and flows therethrough to effect desorption. It will be appreciated that the heater 72 is optional and that in some instances the desired desorption of the sorbed species from the sorbent bed may be effected solely by mass transfer as a result of a concentration differential between the sorbent and the regeneration gas flowing through the sorbent bed.

The sorbent bed is also provide with a discharge line 76 for efflux of the regeneration gas subsequent to its contacting with the sorbent in the sorbent bed. The line 76 may be coupled with a recovery unit 78, in which separation of the desorbate gas may be effected, to recover components thereof for final disposition, recycle or other use. In the illustrated recovery unit, the desorbate gas is separated into a first fraction, which is discharged from the recovery unit in line 80, and a second fraction, which is discharged from the recovery unit in line 82.

Other modes and means of regeneration of the sorbent bed may usefully be employed, as hereinafter more fully described.

At the outlet end of the sorbent bed 54 is provided an effluent tap line 60, which conveys a side-stream of the effluent gas to an endpoint detector 62, as hereinafter more fully described herein. The endpoint detector 62, upon detecting the breakthrough or incipient breakthrough of the species in the effluent being monitored, may be constructed and arranged to generate a control signal that is transmitted in transmission line 64 to the central processing unit (CPU) 66, which may be operatively arranged to effect a corresponding action in the facility.

For example, the system may be arranged so that on incipient breakthrough detection by the endpoint detector, the effluent flow is diverted to a second sorbent bed, or to a holding (surge) vessel for retention until the regeneration of the sorbent bed has been carried out. Alternatively, or additionally, such endpoint breakthrough detection may be employed to initiate a regeneration sequence, to renew the sorbent bed for subsequent on-stream operation.

As mentioned, the features and layout of the semiconductor manufacturing facility shown in FIG. 1 is illustrative in character only, and other features, arrangements and operation may be advantageously employed.

The abatement system of the invention may therefore variously comprise: a) a sorbent-based effluent abatement unit, b) a pre-pump metals trap, pump, and sorbent-based effluent abatement unit, c) a pre-pump metals trap, pump, post-pump cold trap/heating unit, and sorbent-based effluent abatement unit, or d) any other configuration utilizing suitable components selected from, or at a minimum including, one or more of the aforementioned elements.

In an illustrative configuration, the sorbent bed comprises a bed of suitable sorbent material, e.g., high surface area activated carbon. Such sorbent material will remove heavy organometallic species. Activated carbon may be used in any of a number of grades, including high purity bead activated carbon, coconut carbon, bituminous carbon, etc. The sorbent may alternatively comprise carbon impregnated with permanganate, or Wetlerite™ carbon with some metal oxide content providing oxidative properties to the sorbent material.

In addition, special catalytic carbons can be used, such as those commercially available from Calgon Carbon Corporation as part of their Centaur™ product line. These carbons are formulated to have especially high catalytic properties, but without the addition of metal oxides. Illustrative Centaur™ carbons include those described in U.S. Pat. No. 5,356,849 and U.S. Pat. No. 5,494,869, the disclosures of which are hereby incorporated herein by reference in their entireties.

In addition to, or instead of, activated carbon, a high surface area alumina can be used to physically adsorb, as well as to physically trap the metalorganic and organic species. A "wet" alumina may be employed if desired. A high surface area alumina may be impregnated with a strong oxidizer, such as $KMnO_4$, to partially oxidize the organic species. $CuSO_4$-impregnated silica gel may also be employed to provide a lesser oxidizing action, as desired.

$KMnO_4$ is of sufficient strength to oxidize the organic species. An alumina bed will have some affinity for the oxidized products; alternatively, a carbon bed after the alumina bed may be employed so that partially oxidized organic species are adsorbed on the alumina or the activated carbon, while innocuous fragments pass through the system.

Still another approach is to utilize a bed of alumina (or alumina impregnated with a strong oxidizer) over a bed of carbon, as a component of the abatement system.

The abatement system may further, optionally comprise an endpoint detection device, as a means of detecting endpoint or depletion of the sorbent material. The endpoint detection device may for example comprise:

a) a piezoelectric quartz crystal microbalance, with the quartz crystal coated with a thin film coating having affinity for a component of the gas;

b) a colorimetric material, such as $KMnO_4$-impregnated alumina, which can be located in a sightglass (protected from normal light in order to prevent colorimetric property degradation), and which will change color upon oxidation;

c) a thermal conductivity detector on the exhaust of the system; and/or d) an infrared (IR) device, such as a non-dispersive infrared (NDIR) system.

Any of various other endpoint detection schemes could alternatively be used.

The abatement system can also be combined with a method and apparatus for recycle of the organic and organometallic material, if a reversible physisorptive material is employed as the sorbent medium. Upon depletion, the spent canister of physisorbent/chemisorbent material can be removed from the effluent abatement system and can be returned to a regeneration site. At this site heat, vacuum, or both, can be applied to the bed, thereby revolatilizing some or all of the physically adsorbed material. In certain cases when carbon is used as a physisorbent material, it may be advantageous to pyrolyze the carbon, to volatilize the sorbed species and effect their release from the sorbent.

Due to the differing physisorption characteristics of organic and organo-metallic species, the various adsorbed species will elute at different times in the regeneration heat-up or vacuum cycle.

This chromatographic characteristic of the process can be used to separate the valuable sorbate components of the effluent gas from the non-valuable sorbate components. The valuable sorbate components can then be recycled back to the precursor manufacturing process, while the non-valuable components can be disposed of by other means, such as incineration.

Alternatively, the non-valuable sorbate components can be left on the adsorbent media and the adsorbent media can be either incinerated or landfilled. In yet another alternative approach, the regenerated physisorbent/chemisorbent material can be recycled and reused in the multi-component metal oxide CVD effluent abatement process itself.

The present invention also contemplates an apparatus for the regeneration of the spent physisorbent/chemisorbent material. This device comprises a heating element, preferably of a conductive contact or a radiative infrared type, e.g., wrapped around the canister to be regenerated. This first heater prevents heat losses from the bed and eliminates cold spots along the walls, as well as forcing heat into the bed itself.

The first heater will typically rely on conductive mechanisms to transfer heat within the bed itself. In this respect, the thermal conductivity of porous beds is typically poor due to the point- and/or small area-contacts that provide the conductive path for heat transfer. For large diameter beds, this discontinuity of the heat conduction path (due to void volume and interstitial spaces) may be insufficient to allow acceptably short heat-up times for the bed to be achieved, and other heating means and method must be alternatively employed.

Accordingly, where large diameter beds are employed, it may be desirable to use a second convective heater assembly whereby a carrier gas (such as $N_2$, Ar, air, etc.) is passed through a heating device to raise the gas temperature, and the resultantly heated gas is then passed through the physisorbent/chemisorbent bed to be regenerated. In this manner, heat from the carrier gas is applied to the bed.

This second convective heater may be filled with heat transfer enhancement media, such as turbulators, spheres, packing media such as Pall® rings or Intalox® saddles, twisted tape inserts, delta wing inserts, or spiral wound wire inserts (such as those manufactured by Cal Gavin).

The second convective heater may utilize a direct, electrically heated element, or it may use indirect heating (such as inductive heating, etc) to heat the carrier gas. Combustion-based heating may also be used if such mode of heating is compatible with the sorbent material; combustion-based heating should generally not be employed with activated carbon sorbents, due to the flammable nature of many activated carbon compositions.

A vacuum device with throttling means (such as a valve, or a variable flow device (VFD)) may also be provided for vacuum regeneration of the canister. The exhaust of the canister or the vacuum pump may then be fed into a recovery unit, e.g., a condenser, a feed line into a precursor manufacturing unit (whereby the recovered component is reused for synthesis of the source reagent), a reaction vessel, or a distillation recovery process unit.

As an illustrative embodiment of one endpoint detection system in accordance with the present invention, a test was run using a quartz microbalance (QMB) sensor element coated with a simple polymeric coating having affinity for the organic and organometallic components of the effluent.

The polymeric coating is non-reactive with the targeted organic and organometallic species, but has the property of establishing an equilibrium between the vapor phase organic/organometallic species and the same species adsorbed on the polymeric coating. As a result of this equilibrium, when little or no organic passes through the scrubber vessel, little or no organic is adsorbed onto the polymeric coating of the QMB sensor.

However, when organics start to pass through the scrubber, equilibrium constraints cause some of the organic to be adsorbed onto the polymeric coating of the QMB. This resultantly effects a weight change of the QMB and a concomitant change in the frequency output of the QMB. Such change in frequency output may be used to trigger a signal of a suitable type (auditory, visual, tactile, etc.) indicating that the canister has reached endpoint and requires change-out.

This endpoint detection scheme is very versatile in that any of a number of coatings, including hydrophobic or hydrophilic coatings, can be applied to the QMB in order to target specific organic or organometallic species of interest. The QMB sensor preferably utilizes reversible chemistry, so that a slow bleed of organic through the system does not cause false "trips" of the system.

Such QMB technology also can be used in conjunction with various selective adsorbents or traps, in order to allow only target species to pass through to the sensor. For instance, if the QMB sensor coating may tend to physisorb $H_2O$ molecules in circumstances where $H_2O$ is present or may be highly variable in concentration, then a water removal unit, e.g., a Permapure® filter, may be used to remove the bulk of the $H_2O$ molecules from the effluent being monitored by the QMB endpoint detector.

Alternatively, other low cost means of endpoint monitoring may be utilized in the broad practice of the present invention. For example, Kitigawa tubes may be used, having chemistries utilizing Cr(VI) or Cr(VI) and $H_2SO_4$. Some of these tubes give color changes when the monitored component is present and others do not, but such tubes utilize chemistries that can be used as a simple endpoint monitoring means.

Specific endpoint monitoring means may for example comprise:

a) the use of sample tubes with Cr(VI) or Cr(VI)+$H_2SO_4$ characteristics, for periodic "spot sampling" of the exhaust stream of the CVD reactor, b) the incorporation of a sight glass on the scrubber canister, with Cr(VI) or Cr(VI)+$H_2SO_4$ chemistry impregnated onto the resin behind the sight glass, so as produce a visually discernible color change as the end portion of the scrubber resin (sorbent material) is contacted by organic molecules of interest, or c) the incorporation of Cr(VI) or Cr(VI)+$H_2SO_4$ chemistry in an automated monitor using a colorimetric sensing tape, such as that manufactured by Zellweger Analytics and employed in that company's MDA line of monitoring systems.

Another example of a chemistry that is potentially usefully employed in the broad practice of the invention comprises a high surface alumina absorbent loaded with $KMnO_4$ for colorimetric indication upon exposure to organic molecules. A distinct color change is observable after reaction with organic species. This strong oxidizing chemistry can be used in conjunction with any of the physical methods described hereinabove in order to detect an endpoint condition.

For abatement of precursor or organic species, a bed of high surface area organic adsorbent can be used, such as carbon, or organic polymer adsorbents such as Dow Sorbathene® pellets or Rohm and Haas Amberlite® pellets. A bed of high surface inorganic material can also be used, such as alumina, molecular sieve, silica gel, hydrophobic zeolites, hydrophilic zeolites, etc. In addition, a bed of high surface area adsorbent (either organic or inorganic) impregnated with a strong oxidizer, such as $KMnO_4$, could also be utilized for some or all of the sorbent bed.

While the invention has been described in specific reference to multi-component metal oxides, it is understood that the abatement method and apparatus of the invention can be applied to other processes utilizing low vapor pressure, metalorganic species that can be delivered by liquid delivery systems.

The features and advantages of the invention are more fully shown with reference to the following examples. Although illustrated herein with reference to these specific examples involving treatment of effluent from a CVD BST process, it will be recognized that the apparatus and methodology disclosed herein may be widely and effectively employed for the abatement of streams deriving from operations utilizing multi-component metal oxides deposited by CVD processes.

EXAMPLE 1

Post-pump FTIR characterization of gas-phase BST process effluents on a commercially available BST tool using precursor BST9-0047 (Advanced Technology Materials, Inc., Danbury, Conn.) at a delivery flow rate of 35 mg/min. The BST precursor mixture included:

bis(TMHD)bariumpentamethyldiethylenetriamine
bis(TMHD)strontiumpentamethyldiethylenetriamine
bis(isopropoxy)bis(TMHD)titanium.

The metalorganic reactants used a Ba/Sr volume ratio of about 3/2 and were combined with n-butyl acetate. Oxygen was used as the oxidizing agent and flowed at 0.5 standard liters per minute (slpm). Nitrogen and argon were used as transport gases. The reactor and liquid delivery systems were flushed with n-butyl acetate (nBA) for 5 to 10 minutes before and after deposition of all wafers. Flushes lasted typically 5 to 10 minutes, and the solvent was introduced at a rate of 500 standard cubic centimeters per minute (sccm). Wafers were processed sequentially with a deposition lasting 3.5 minutes per wafer at a deposition rate of 70 Angstroms/minute. Wafer handling and transfer time between depositions was approximately 2.5 minutes.

During wafer handling and transfer, the BST precursor composition and solvent were bypassed around the deposition chamber. An Edwards QDP dry pump was used as the reaction chamber vacuum source. The system utilized a cold trap before the pump, but no post-pump treatment of the effluent.

Significant volumes of nBA were measured during flushes, with concentration up to 900 to 1250 parts per million (ppm), or close to 10 times the Federal and ACGIH exposure limits of 150 ppm. The concentration profiles generated during deposition showed a decrease in nBA concentrations every time a wafer was processed at the expense of forming carbon oxides. The nBA before deposition (but while not flushing) was shown to be stable at a concentration of 45.5 ppm. During deposition, the solvent concentration dropped to 32.5% to 30.9 ppm. At the same time, CO concentrations rose rapidly to 24.1 ppm while $CO_2$ concentrations rose rapidly to 30.7 ppm.

TLV and ½ IDLH levels for each of the potential species involved was as follows:

|  | TLV | ½ IDLH |
|---|---|---|
| Barium precursor | Unknown | Unknown |
| Strontium precursor | Unknown | Unknown |
| Titanium precursor | Unknown | Unknown |
| nBA | 150 ppm | 5000 ppm |
| THF | 200 ppm | 10000 ppm |
| CO | 50 ppm | 750 ppm |
| $CO_2$ | 5000 ppm | 25000 ppm |

This system operation was characterized by a number of deficiencies:

(1) The volumes of nBA measured during flushes are close to 10 times the federal and ACGIH exposure limits (TLV) of 150 ppm, although they were well below the ½ IDLH level of 5000 ppm.
(2) The volumes of nBA, especially those measured during flushes, pose odor issues.
(3) Some Ba, Sr and Ti species (either precursor species, or byproducts of precursor decomposition) pass through the cold trap and are not abated.
(4) Volumes of CO and $CO_2$ formed in the process contribute to greenhouse warming of the environment.

EXAMPLE 2

The system of Example 1 is modified by providing (downstream of the pump) a two-zone sorbent unit including a bed of alumina as a first stage of the two-zone sorbent unit, and a bed of $KmnO_4$-impregnated activated carbon as the second stage of the two-zone sorbent unit. The effluent from the pump is flowed in sequence through the first and second sorbent beds. Periodically, heat and vacuum are applied to the sorbent beds to desorb adsorbed species therefrom. The desorbate vapor species are then sent to a vapor recovery process and separated to recover the organic components of the vapor. A quartz microbalance detector, having a coating on the piezoelectric quartz crystal element with sorptive affinity for an organic component of the effluent, is coupled to the discharge line of each of the first and second sorbent beds, to monitor the discharged effluent gas for breakthrough of organic species therein, so that the sorbent beds can be changed out and charged with fresh sorbent material, for high efficiency abatement of the effluent.

While the invention has been described herein with reference to specific features and illustrative embodiments, it will be recognized that the utility of the invention is not thus limited, but rather extends to and encompasses other features, modifications and alternative embodiments, as will readily suggest themselves to those of ordinary skill in the art based on the disclosure and illustrative teachings herein. The claims that follow are therefore to be construed and interpreted, as including all such features, modifications and alternative embodiments within their spirit and scope.

What is claimed is:

1. An apparatus for abatement of effluent from a CVD process for depositing multi-component metal oxide films on a substrate from corresponding metal source reagents, said apparatus comprising:
   at least one sorbent bed comprising adsorbent material, wherein the adsorbent material comprises a carbon sorbent comprising an- oxidizing material selected from the group consisting of permanganates and metal oxides, having sorptive affinity for said metal source reagents and CVD process by-products thereof; and
   a flow path coupling the CVD process with said sorbent bed so that effluent flows from the CVD process to the sorbent bed, to remove residual source reagents and CVD process by-products thereof from the effluent.

2. The apparatus of claim 1, further comprising a pump in said flow path.

3. The apparatus of claim 2, further comprising a metals trap upstream of the pump.

4. The apparatus of claim 2, further comprising a cold trap downstream of the pump.

5. The apparatus of claim 1, wherein the sorbent bed is arranged to be regeneratable.

6. The apparatus of claim 1, further comprising an endpoint detector selected from the group consisting of a colorimetric change detector comprising $KMnO_4$, a thermal conductivity detector and a non-dispersive infrared detector, wherein the endpoint detector is coupled to a discharge portion of the sorbent bed.

7. The apparatus of claim 6, further comprising a second sorbent bed having sorptive affinity for organic and metalorganic species, wherein the adsorbent material comprises alumina, and the second sorbent bed is positioned before the sorbent bed comprising the carbon sorbent.

8. The apparatus of claim 1, further including a semiconductor manufacturing facility whose operation comprises said MOCVD process.

9. The apparatus of claim 1, wherein the CVD process for depositing a multi-component metal oxide film on a substrate is a process for depositing BST.

10. An apparatus for abatement of effluent from a liquid delivery CVD process for depositing BST on a substrate from a precursor composition including corresponding barium strontium titanate metalorganic source reagents, wherein organic solvent is contained in the precursor composition and/or employed as a flush medium in the liquid delivery CVD process, and organic solvent correspondingly is present in effluent from the liquid delivery CVD process, said apparatus comprising an effluent flow circuit including in sequence a metals trap, a motive fluid driver, and at least one sorbent comprising adsorbent material, wherein the adsorbent material comprises a carbon sorbent comprising an- oxidizing material selected from the group consisting of permanganates and metal oxides, having sorptive affinity for organic species.

11. The apparatus of claim 10, further including a semiconductor manufacturing facility whose operation comprises said CVD process.

12. The apparatus of claim 10, further comprising an endpoint detector arranged to detect breakthrough of organic species in the sorbent bed, wherein the endpoint detector is selected from the group consisting of a colorimetric change detector comprising $KMnO_4$, a thermal conductivity detector and a non-dispersive infrared detector.

13. The apparatus of claim 10, wherein the sorbent bed is regeneratable for recovery of previously sorbed organic species therefrom.

* * * * *